United States Patent
Coban

(10) Patent No.: US 10,469,112 B2
(45) Date of Patent: Nov. 5, 2019

(54) SYSTEM, APPARATUS AND METHOD FOR PERFORMING AUTOMATIC GAIN CONTROL IN A RECEIVER FOR A PACKET-BASED PROTOCOL

(71) Applicant: Silicon Laboratories Inc., Austin, TX (US)

(72) Inventor: Abdulkerim L. Coban, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 36 days.

(21) Appl. No.: 15/609,337

(22) Filed: May 31, 2017

(65) Prior Publication Data

US 2018/0351592 A1   Dec. 6, 2018

(51) Int. Cl.
*H04B 1/10* (2006.01)
*H03F 3/195* (2006.01)
*H03G 3/30* (2006.01)

(52) U.S. Cl.
CPC ........... *H04B 1/1036* (2013.01); *H03F 3/195* (2013.01); *H03G 3/3068* (2013.01); *H03G 3/3078* (2013.01); *H03F 2200/294* (2013.01); *H03F 2200/333* (2013.01); *H03F 2200/451* (2013.01); *H03F 2200/465* (2013.01)

(58) Field of Classification Search
CPC .... H03G 3/3068; H04B 17/318; H04W 52/52
See application file for complete search history.

(56) References Cited

U.S. PATENT DOCUMENTS

| | | | | |
|---|---|---|---|---|
| 5,095,533 A | * | 3/1992 | Loper | H03G 3/3068 330/284 |
| 5,734,683 A | * | 3/1998 | Hulkko | H03D 3/008 375/247 |
| 5,777,494 A | * | 7/1998 | Takahashi | H03K 5/086 327/72 |
| 6,195,399 B1 | * | 2/2001 | Dent | H03D 3/009 375/322 |
| 6,735,260 B1 | * | 5/2004 | Eliezer | H04L 25/065 360/39 |
| 6,771,720 B1 | * | 8/2004 | Yang | H03G 3/3068 375/345 |
| 7,212,798 B1 | * | 5/2007 | Adams | H03G 3/3068 330/278 |
| 8,180,308 B1 | * | 5/2012 | Neng | H03G 3/3068 455/226.2 |
| 8,346,202 B2 | | 1/2013 | Coban et al. | |
| 8,554,136 B2 | * | 10/2013 | McCormack | H04B 5/02 455/41.1 |

(Continued)

FOREIGN PATENT DOCUMENTS

WO   WO-2013130486 A1 *   9/2013   ............ G06F 13/00

*Primary Examiner* — Berhanu Tadese
(74) *Attorney, Agent, or Firm* — Trop, Pruner & Hu, P.C.

(57) ABSTRACT

In one example, a method includes: at a beginning of a packet communication, setting a maximum gain setting for a plurality of gain components of a receiver; and during a preamble portion of the packet communication, reducing a gain setting for one or more of the plurality of gain components in response to at least one of a first signal output by a first component of the receiver being greater than a first threshold and a second signal output by a second component of the receiver being greater than a second threshold.

18 Claims, 6 Drawing Sheets

(56) References Cited

U.S. PATENT DOCUMENTS

| | | | |
|---|---|---|---|
| 8,811,526 B2* | 8/2014 | McCormack | H01L 23/66 327/291 |
| 8,912,785 B2* | 12/2014 | Horvath | G01R 21/01 324/103 P |
| 9,172,344 B2 | 10/2015 | Green et al. | |
| 9,203,452 B2* | 12/2015 | Li | H04N 5/455 |
| 9,322,904 B2* | 4/2016 | McCormack | G01S 13/04 |
| 9,379,450 B2* | 6/2016 | Kyles | H01L 23/49861 |
| 9,407,311 B2* | 8/2016 | McCormack | H04B 1/40 |
| 9,426,660 B2* | 8/2016 | McCormack | H04L 63/0428 |
| 9,444,523 B2* | 9/2016 | McCormack | G01S 13/04 |
| 9,515,365 B2* | 12/2016 | McCormack | H01P 3/122 |
| 9,515,859 B2* | 12/2016 | McCormack | H01L 23/66 |
| 9,736,790 B1* | 8/2017 | Haub | H04W 52/245 |
| 9,948,347 B2* | 4/2018 | Milenkovic | H04B 17/12 |
| 2004/0190650 A1* | 9/2004 | Khorram | H04L 25/062 375/334 |
| 2004/0196017 A1* | 10/2004 | Sutardja | H02M 1/088 323/283 |
| 2005/0186910 A1* | 8/2005 | Moorti | H01Q 1/1257 455/65 |
| 2005/0186917 A1* | 8/2005 | Rofougaran | H03F 3/245 455/73 |
| 2007/0248192 A1* | 10/2007 | Brunsch | H04L 25/40 375/340 |
| 2008/0160945 A1* | 7/2008 | Crinon | H01Q 1/241 455/234.1 |
| 2010/0026547 A1* | 2/2010 | Weissman | H04B 1/1027 342/16 |
| 2010/0153589 A1* | 6/2010 | Maroni | G06F 13/4072 710/18 |
| 2010/0172450 A1* | 7/2010 | Komaili | H04L 27/3809 375/345 |
| 2010/0246714 A1* | 9/2010 | Yang | H04L 25/49 375/296 |
| 2011/0009080 A1* | 1/2011 | Seendripu | H03D 3/008 455/142 |
| 2012/0121043 A1* | 5/2012 | Wambacq | H04B 7/084 375/327 |
| 2012/0249366 A1* | 10/2012 | Pozgay | H04B 7/18571 342/354 |
| 2012/0263244 A1* | 10/2012 | Kyles | H01L 23/49861 375/259 |
| 2012/0307932 A1* | 12/2012 | McCormack | H01L 23/66 375/295 |
| 2012/0319774 A1* | 12/2012 | Ibrahim | H03G 3/3068 330/129 |
| 2012/0326904 A1* | 12/2012 | Jensen | H03M 3/396 341/131 |
| 2013/0070817 A1* | 3/2013 | McCormack | H04B 1/18 375/219 |
| 2013/0195215 A1* | 8/2013 | Manglani | H03G 3/3068 375/295 |
| 2013/0196598 A1* | 8/2013 | McCormack | H01L 23/66 455/41.1 |
| 2013/0257670 A1* | 10/2013 | Sovero | H01Q 1/24 343/833 |
| 2013/0316653 A1* | 11/2013 | Kyles | H04B 1/40 455/67.11 |
| 2014/0016723 A1* | 1/2014 | Mu | H04B 1/62 375/296 |
| 2014/0160939 A1* | 6/2014 | Arad | H04L 47/122 370/237 |
| 2014/0273856 A1* | 9/2014 | Kyles | H04B 1/401 455/41.2 |
| 2014/0273894 A1* | 9/2014 | McCormack | H04B 5/0031 455/113 |
| 2014/0281534 A1* | 9/2014 | McCormack | H04L 63/0428 713/168 |
| 2014/0286643 A1* | 9/2014 | George | H04B 10/25759 398/115 |
| 2014/0341232 A1* | 11/2014 | McCormack | H04B 1/0096 370/466 |
| 2015/0031320 A1* | 1/2015 | Li | H04B 1/123 455/207 |
| 2015/0048959 A1* | 2/2015 | Zhu | H03M 1/0617 341/118 |
| 2015/0065069 A1* | 3/2015 | McCormack | H04B 1/18 455/90.2 |
| 2015/0094002 A1* | 4/2015 | Kyles | H04B 1/40 455/77 |
| 2015/0131683 A1* | 5/2015 | de Ruijter | G06F 13/4295 370/514 |
| 2015/0381228 A1* | 12/2015 | Milenkovic | H04B 17/12 375/219 |
| 2016/0036495 A1* | 2/2016 | McCormack | G01S 13/04 455/41.1 |
| 2016/0064827 A1* | 3/2016 | Kyles | H01L 23/49861 343/833 |
| 2016/0344484 A1* | 11/2016 | Nakamura | H04B 17/13 |
| 2016/0380676 A1* | 12/2016 | McCormack | G01S 13/04 455/41.1 |
| 2017/0046299 A1* | 2/2017 | Isaac | G06F 13/4068 |
| 2017/0086281 A1* | 3/2017 | Avrahamy | C02F 1/42 |
| 2017/0373709 A1* | 12/2017 | Kondo | H03L 7/085 |
| 2018/0041235 A1* | 2/2018 | Kyles | H04L 25/0266 |
| 2018/0309602 A1* | 10/2018 | Zheng | H04L 25/06 |

* cited by examiner

SYSTEM, APPARATUS AND METHOD FOR PERFORMING AUTOMATIC GAIN CONTROL IN A RECEIVER FOR A PACKET-BASED PROTOCOL

BACKGROUND

In radio receivers, an incoming radio frequency (RF) signal is received, typically by an antenna. The signal is then processed in a signal processing path of the receiver. General receive operations include amplification, filtering, downconversion, and digitization, resulting in a digitized signal that can then be digitally processed, such as demodulation for a particular modulation technique.

Many receivers include multiple amplifiers or other gain components. At least some of these gain components may be controlled. While many gain control techniques are known, such techniques can suffer from various impairments, including complexity and processing difficulties. One reason for difficulty in certain techniques is reliance on received signal strength indicator (RSSI) information, which is only available after digital processing of the signal, which in turn may lead to delays in updating the gain components, which can adversely impact receiver operation.

SUMMARY OF THE INVENTION

In one aspect, an embodiment includes a receiver having: a low noise amplifier (LNA) to receive and amplify a radio frequency (RF) signal and having a first controllable gain; a mixer to downconvert the RF signal to an intermediate frequency (IF) signal; a first filter coupled to the mixer to filter the IF signal; a programmable gain amplifier (PGA) coupled to the first filter to amplify the filtered IF signal and having a second controllable gain; a digitizer to digitize the filtered IF signal to a digitized signal; a digital signal processor (DSP) to process the digitized signal; a first power detector to output a first detection signal having a first value in response to the RF signal exceeding a first threshold; a second power detector to output a second detection signal having the a third value in response to the IF signal exceeding a second threshold; and a controller to dynamically update a gain setting of one or more of the LNA and the PGA from a maximum gain setting in response to the first detection signal and the second detection signal.

In an embodiment, for a first packet communication, the controller is to update the gain setting of the one or more of the LNA and the PGA no more than three times during a preamble portion of the first packet communication, based on the first detection signal and the second detection signal. The controller may further update the gain setting of the one or more of the LNA and the PGA based on received signal strength indication information obtained from the DSP, when the controller updates the gain setting during the preamble portion less than the three times.

In an embodiment, the controller is to maintain the maximum gain setting in response to the first detection signal having a second value in response to the RF signal being less than the first threshold and the second detection signal having a fourth value in response to the IF signal being less than the second threshold. The controller may further update a gain setting of a passive gain network coupled to receive the RF signal from an antenna and to provide the RF signal to the LNA. The controller may update the gain setting of the one or more of the LNA and the PGA to a first predetermined gain setting in response to the second detection signal having the first value and the first detection signal having a second value in response to the RF signal being less than the first threshold. In an embodiment, the controller is to obtain the first predetermined gain setting from a table. In this embodiment, the receiver may further include a non-volatile storage to store the table, the table having a plurality of entries each having predetermined gain settings for at least the LNA and the PGA. The predetermined gain settings in the plurality of entries may be based on a priori knowledge of characteristics of the receiver, including a ratio of undesired-to-desired signal, gain characteristics of the receiver, filtering characteristics of the receiver, and a noise figure as a function of the gain setting of the receiver.

In another aspect, a method includes: at a beginning of a packet communication, setting a maximum gain setting for a plurality of gain components of a receiver; and during a preamble portion of the packet communication, reducing a gain setting for one or more of the plurality of gain components in response to at least one of a first signal output by a first component of the receiver being greater than a first threshold and a second signal output by a second component of the receiver being greater than a second threshold.

In an embodiment, the method further comprises reducing the gain setting using a predetermined gain setting for the one or more of the plurality of gain components, the predetermined gain setting obtained from a non-volatile storage. The non-volatile storage may be accessed based at least in part on the first detection signal and the second detection signal to obtain the predetermined gain setting. The method may further include, after reducing the gain setting, using the predetermined gain setting for the one or more of the plurality of gain components, to update the gain setting for one or more of the plurality of gain components based on received signal strength indicator information, during the preamble portion of the packet communication.

In an embodiment, the method may further include: receiving a first detection signal from a RF peak detector of the receiver to identify that the first signal is greater than the first threshold; and receiving a second detection signal from an IF peak detector of the receiver to identify that the second signal is greater than the second threshold. The method may further include reducing the gain setting for the one or more of the plurality of gain components for no more than two iterations, during the preamble portion of the packet communication. In this way, the receiver may be controlled to not saturate during a payload portion of the packet communication.

In another aspect, a system includes: an antenna to receive a RF signal; a first amplifier coupled to the antenna to amplify the RF signal, the first amplifier having a first controllable gain; a mixer to downconvert the RF signal to a second frequency signal; a second amplifier coupled to the mixer to amplify the second frequency signal, the second amplifier having a second controllable gain; a digitizer to digitize the second frequency signal to a digitized signal; a DSP to process the digitized signal; a first peak detector to output an active first detection signal in response to the RF signal exceeding a first threshold; a second peak detector to output an active second detection signal in response to the second frequency signal exceeding a second threshold; and a gain controller to set a gain setting of the first amplifier to a first maximum gain setting and set a gain setting of the second amplifier to a second maximum gain setting, and during a preamble portion of the RF signal to reduce the gain setting of the first amplifier to a first predetermined gain setting and reduce the gain setting of the second amplifier to a second predetermined gain setting in response to at least one of the active first detection signal and the active second detection signal.

In an embodiment, the gain controller is to maintain the first maximum gain setting and the second maximum gain setting in response to an inactive first detection signal in response to the RF signal being less than the first threshold and an inactive second detection signal in response to the second frequency signal being less than the second threshold. The gain controller may further, during the preamble portion, update the gain setting of at least one of the first amplifier and the second amplifier after the reduction of the gain setting of the first amplifier and the reduction of the gain setting of the second amplifier, based on received signal strength indication information obtained from the DSP.

In an embodiment, the system includes a non-volatile storage to store a plurality of entries each having predetermined gain settings for at least the first amplifier and the second amplifier, and where the gain controller is to access a first entry to obtain the first predetermined gain setting and the second predetermined gain setting based at least in part on the active first detection signal and the active second detection signal.

DETAILED DESCRIPTION

Figure 1:
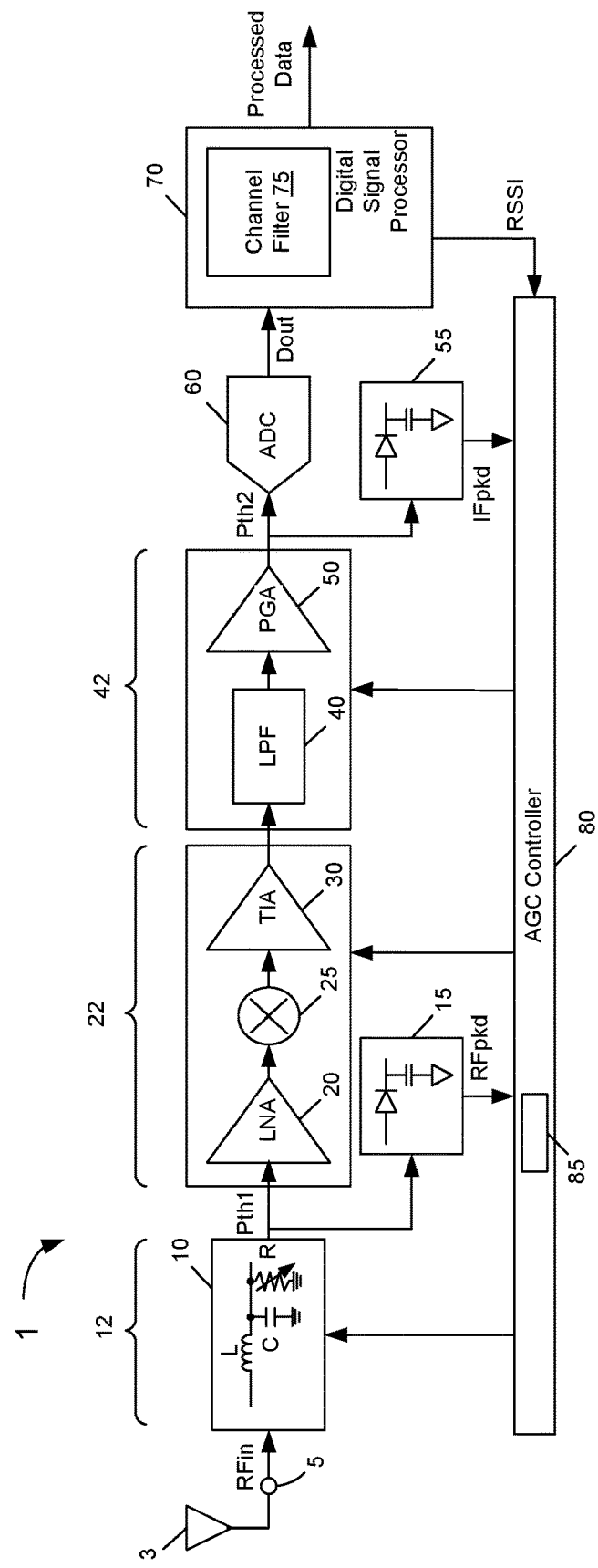
FIG. 1 is a block diagram of a receiver in accordance with an embodiment.

In various embodiments, a receiver is provided with techniques for performing automatic gain control (AGC) operation in a manner to quickly update gain settings of various gain components of the receiver so that communicated information is not lost. More specifically, embodiments may be used in receivers for a wide range of packet-based communication protocols, as examples, in which AGC component updates can occur within a preamble portion of the packet communication, so that gain settings can be updated and finalized, prior to communication of actual payload data of the packet. As examples, packet-based protocols such as Bluetooth™, Zigbee™, as well as many other Internet of Things (IoT) protocols may leverage embodiments. Embodiments also may be applicable to receivers for constant amplitude modulated signals (such as frequency shift keying (FSK), Gaussian frequency shift keying (GFSK), minimum shift keying (MSK)), and most other sub-gigahertz (GHz) IoT standards.

In particular examples described herein, a gain back-off technique may be used in which a gain control process is begun with maximum gain settings for multiple gain components of the receiver, and selectively one or more of these gain settings are reduced to other predetermined values, based on signal levels measured with the maximum gain settings in effect. In one particular embodiment, at most a three-step process is performed to finalize gain settings. Understand further that in some embodiments the AGC techniques described herein may first perform gain control of the gain components using signal information obtained from power detectors (also referred to herein as peak detectors) within radio frequency (RF) and intermediate frequency (IF) sections of the receiver. Then, only optionally may received signal strength indicator (RSSI) information that is obtained from digitally processed signal information be used to (potentially) fine tune one or more of the gain components.

In embodiments, an AGC technique may be adapted to settle at the arrival of a packet before an actual payload starts. At the end of the process, gain is typically settled to a minimum level at which a required signal-to-noise ratio (SNR) (such as a SNR specified by a receiver manufacturer, or a SNR specified by a given communication protocol) is met with a few decibels (dB) of margin. In this way, the dynamic range of the receive chain is maximized and therefore the saturation of a receiver channel is prevented if a relatively strong blocker arrives during reception of desired data. In contrast to embodiments, conventional AGC algorithms use RSSI information to drive gain control. The settling of the RSSI after a gain change, however, is relatively slow as a signal passes through a complete receiver chain including the digital channel filter. Also, visibility of a blocker location and its level are low in RSSI reading.

An AGC technique in accordance with an embodiment also uses relevant signal chain information, including (but not limited to): gain and filtering characteristics along the signal chain, undesired-to-desired signal ratio (U/D) the signal chain is specified to tolerate at various offset frequencies (e.g., 40 dB for adjacent channel at reference sensitivity, 50 dB at two channels away), and a noise figure (NF) as a function of gain setting. With this information, the AGC technique can quickly set the next gain setting based on multiple peak detector readings.

Referring now to FIG. 1, shown is a block diagram of a receiver in accordance with an embodiment. As shown in FIG. 1, receiver 1 is a radio receiver having an input node. In various embodiments, input node 5, which may be an input pin of an integrated circuit (IC) including the receiver, receives an incoming RF signal (RFin) from an antenna 3. As seen, the RF signal is provided to an attenuator 10. In an embodiment, attenuator 10 may be implemented as a passive gain network, e.g., including an inductor (L) and parallel-coupled capacitance (C) and resistance (R). In different embodiments, one or more of these RLC components can be dynamically controlled to control an amount of attenuation, such that attenuator 10 is considered one of the gain components of receiver 1. Note that attenuator 10 constitutes a first gain control region 12 of receiver 1. Although embodiments are not limited in this regard, in one particular embodiment attenuator 10 may provide for a controllable gain of −11 dB to 9 dB (e.g., with 2 dB steps per update). In one embodiment, the resistance R may be dynamically controlled to adjust the gain setting of first gain control region 12.

After any attenuation in attenuator 10, the RF signal is provided to a low noise amplifier (LNA) 20. After amplification in LNA 20, the RF signal is provided to a mixer 25. In various embodiments, mixer 25 may downconvert the RF signal to an IF signal. From there, the IF signal is provided to a transimpedance amplifier (TIA) 30, which converts mixer IF current into a voltage signal. Note that LNA 20, mixer 25 and TIA 30 constitute a second gain control region 22 of receiver 1. Although embodiments are not limited in this regard, in one particular embodiment, second gain control region 22 (and in some cases specifically LNA 20) may have a controllable gain that ranges from 4 dB to 30 dB (e.g., with two dB steps).

The RF signal after attenuation in attenuator 10 is further provided to a first peak detector 15, which operates as a wide-band detector to compare the power of the RF signal output from attenuator 10 to a first threshold (Pth1). When the RF signal level exceeds this threshold, peak detector 15 outputs an active detection signal, RFpkd, to an AGC controller 80, details of which are described below. Although embodiments are not limited in this regard, in one particular embodiment this first threshold Pth1 may be set at −26 dBm. Of course other values are possible in other embodiments.

Still with reference to FIG. 1, the output of TIA 30 is provided to a low pass filter (LPF) 40 for low pass filtering. This low pass filtered signal is provided to a programmable gain amplifier (PGA) 50. In the embodiment shown, LPF 40 and PGA 50 constitute a third gain control region 42. Although embodiments are not limited in this regard, in one particular embodiment third gain controller region 42 may have a controllable gain of between −12 dB to 12 dB (e.g., with two dB steps).

Note that the IF signal output from PGA 50 is provided to a digitizer, namely an analog-to-digital converter (ADC) 60. As further illustrated, this IF signal is further provided to another peak detector 55, which in the embodiment shown is an IF peak detector. Peak detector 55 operates as a narrowband detector to compare this IF signal power to a second threshold (Pth2). In one embodiment, this second threshold Pth2 may be set at −15 dBm, although of course other values are possible. As with the discussion above, when the IF signal level exceeds this threshold, peak detector 55 outputs an active detection signal, IFpkd, to AGC controller 80. Also, with the above-described example gain controllability for the first, second and third gain control regions, the receiver overall may have a controllable gain total (Gtotal) of 51 dBm. More specifically, each of the individually controllable gain control regions may have maximum gain settings of, respectively, 9 dBm, 30 dBm and 12 dBm (corresponding to max(G1, G2, G3)).

Still referring to FIG. 1, the digitized output of ADC 60 (Dout) is provided to a digital signal processor (DSP) 70. As illustrated, channel filtering may be performed in a channel filter 75. Furthermore, DSP 70 may analyze the channel filtered output to determine RSSI information which, as described herein, may be used to perform fine tuning of one or more of the gain components, in certain cases. DSP 70 may also digitally process and output processed data.

AGC controller 80, in an embodiment, may be implemented as a dedicated microcontroller or other programmable hardware control circuit such as programmable logic. In other cases, AGC controller 80 may be implemented using other hardware circuitry, firmware, software and/or combinations thereof to control gain settings of various gain components within receiver 1 based on the detected outputs from peak detectors 15 and 55. Furthermore, understand that AGC controller 80 may efficiently perform this gain control within a small time window, e.g., completely within a preamble portion of a data communication, such that no payload data of the communication is lost.

As further illustrated, AGC controller 80 includes a storage 85, which in embodiments may be implemented as a non-volatile storage or other non-transitory storage medium. Non-volatile storage 85 may store a table including a plurality of entries, each to store a set of predetermined gain settings for the various gain components of receiver 1, such that under control of gain controller 80, a selected group of settings can be accessed and used to update the gain settings of the corresponding gain components within receiver 1. Note that predetermined gain settings may be used, since characteristics of the receiver known a priori are used to determine these gain settings, e.g., during design time, as confirmed during laboratory testing of actual receivers (such as manufactured integrated circuits). In this way, it is guaranteed that these predetermined settings, when used by a controller as described herein to perform AGC operations during a preamble portion of a packet communication, enable a receiver to perform receive operations in a manner that guarantees and ensures that the receiver does not saturate. That is, even in situations where changes in signal conditions occur, including the sudden appearance of one or more strong blocker channels, saturation is prevented. In some embodiments, storage 85 may further store instructions that when executed by controller 80 enable receiver 1 to perform AGC techniques described herein, including the gain back-off techniques performed wholly within a preamble portion of a packet communication.

Figure 2A:
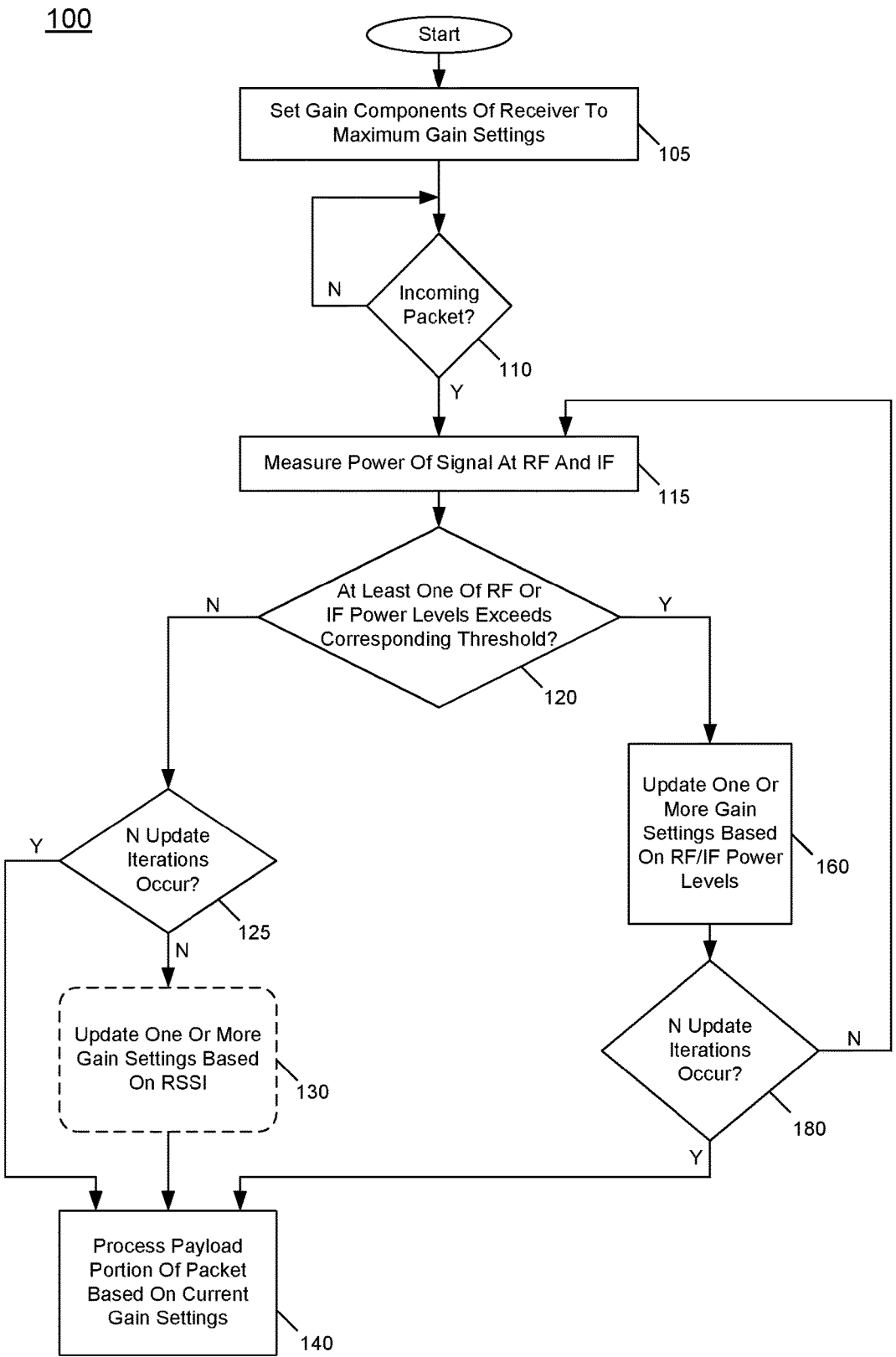
FIG. 2A is a flow diagram of a method in accordance with an embodiment.

Referring now to FIG. 2A, shown is a flow diagram of a method in accordance with an embodiment. More specifically, method 100 is a method for performing automatic gain control as described herein. As such, method 100 may be performed by an AGC controller such as AGC controller 80 of FIG. 1 to perform AGC during a preamble portion of a packet communication. As illustrated, method 100 begins by setting gain components of the receiver to their maximum gain settings (block 105). Next, control passes to diamond 110, where it is determined whether an incoming packet is being received within a receiver. If so, control passes to block 115, where power of the signal within a receiver chain may be measured at both RF and IF (using peak detectors as described herein).

Next it is determined at diamond 120 if at least one of these power levels exceeds a corresponding threshold. If not, the maximum gain settings may be appropriate and accordingly, control passes to diamond 125. As seen, at diamond 125 it can be determined whether a given number (e.g., N) of gain update iterations has occurred. In different embodiments, this number N may be programmable. In one particular embodiment, N may be set to two, such that (at most) two gain setting updates (after an initial gain setting) may occur before the AGC operations conclude. When it is determined that this given number of updated iterations has occurred, control passes to block 140 where processing of the received packet may occur with the current gain settings.

If instead it is determined at diamond 125 that the given number of update iterations have not occurred, control passes to optional block 130. At block 130, one or more of these gain settings can be updated based on RSSI information, as there is still available time within the preamble portion and before a payload portion of the data communication begins to obtain RSSI information (based on further processing of the received signal). Thereafter, control passes to block 140 where the payload portion is received and processed with the current gain settings.

Still with reference to FIG. 2A, instead if it is determined at diamond 120 that at least one of the power levels exceeds the corresponding threshold, control passes to block 160 where one or more gain settings may be updated based upon these detected power levels. Understand that as described herein, depending upon which detectors are tripped and the number of previously performed gain updates, a given predetermined set of gain settings, e.g., stored in a non-volatile storage, may be obtained and used to update the gain settings at block 160. Control passes from block 160 to diamond 180 where it is determined whether N update iterations have occurred. If the given number of update iterations has not yet occurred, control passes back to block 115 where the power measurements may be made again. If instead it is determined that the given number of update iterations have occurred, control passes to block 140 for receiving and processing the payload portion with the current gain settings. Understand while shown at this high level in the embodiment of FIG. 2A, many variations and alternatives are possible.

Figure 2B:
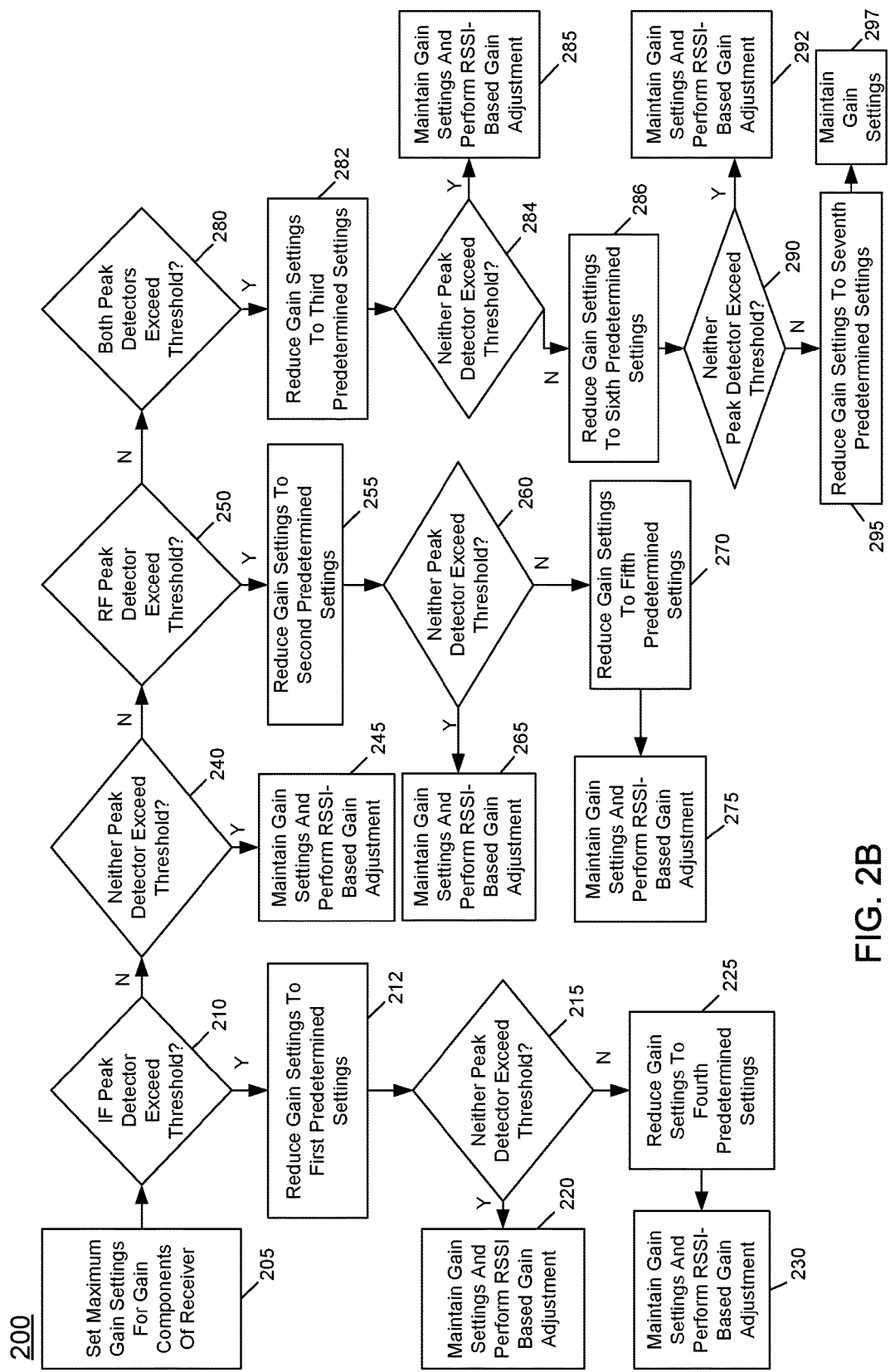
FIG. 2B is a flow diagram of a method in accordance with another embodiment.

Referring now to FIG. 2B, shown is a flow diagram of another method in accordance with an embodiment. Method 200 may be performed by an AGC controller such as AGC controller 80 of FIG. 1 to perform AGC during a preamble portion of a packet communication. As seen, method 200 begins by setting maximum gain settings for the gain components of the receiver (block 205). Note that this gain control may occur at a beginning of a received packet, e.g., during a preamble portion of the packet. In embodiments the AGC control of method 200 is initiated at the beginning (during a preamble section) of each packet during reception. The received data typically has multiple packets.

In any event, method 200 passes from block 205 to diamond 210 to determine whether the IF peak detector (and only the IF peak detector) exceeds its threshold. In an embodiment, this determination may be based on the output of the IF peak detector, which may be a logic high value when the IF signal exceeds its threshold. If so, control passes to block 212 where the gain settings may be reduced to a first set of predetermined settings which may be obtained from a given storage. After this update to the gain settings and another measurement by the peak detectors, it is determined at diamond 215 whether neither of the peak detectors exceeds its threshold. If so, the current gain setting may be maintained (block 220). However, to perform any fine updates, one or more of the gain settings may be adjusted based on RSSI information. Nonetheless, understand that with this path through method 200, a finalized gain setting occurs in only two steps, namely after an initial gain setting, an initial measurement, a second gain setting and a second measurement.

Instead if it is determined at diamond 215 that at least one of the peak detectors exceeds its threshold, control passes to block 225 where the gain settings may be reduced to a fourth predetermined set of settings, e.g., obtained from another entry of the storage. At this point with this third pass with a gain update, it is ensured that a correct gain setting is present and as such, control passes to block 230 where the gain setting may be maintained (with potential update by RSSI information).

Still with reference to FIG. 2B, if it is determined at diamond 210 that only the IF peak detector does not exceed its threshold, control passes to diamond 240 to determine, after this initial gain setting whether neither peak detector exceeds its corresponding threshold. If this is the case, control passes to block 245, where the gain setting may be maintained (with potential update by RSSI information).

If diamond 240 is in the negative, control passes to diamond 250 to determine whether (only) the RF peak detector exceeds its threshold. If so, control passes to block 255 where the gain settings can be reduced to a second set of predetermined settings. After that, another measurement occurs, and it is determined at diamond 260 whether neither of the peak detectors exceeds their threshold. If so, control passes to block 265, where the gain setting may be maintained (with potential update by RSSI information). Otherwise, control passes to block 270 where the gain settings may be reduced to a fifth set of predetermined settings. From block 270, control passes to block 275 where the gain settings may be maintained (with potential update by RSSI information).

Still referring to FIG. 2B, if it is determined at diamond 280 that both peak detectors exceed their threshold, control passes to block 282 where the gain settings may be reduced to a third set of predetermined settings. After these settings are updated and another measurement obtained from the peak detectors, at diamond 284 it is determined whether neither peak detector exceeds their threshold. If this is the case, control passes to block 285, where the gain settings may be maintained (with potential update by RSSI information). If not, control passes to block 286 where the gain settings may be reduced to a sixth set of predetermined settings. After these settings are updated and another measurement obtained from the peak detectors, at diamond 290 it is determined whether neither peak detector exceeds their threshold. If so, control passes to block 292 where the gain settings may be maintained (with potential update by RSSI information). Otherwise if it is determined that at least one peak detector exceeds its threshold, control passes to block 295, where the gain settings may be reduced to a seventh set of predetermined settings. At this point after the various updates to the gain settings, it is ensured that the gain settings are appropriate and thus method 200 concludes (at block 297), without an optional update based on RSSI information. Understand while shown at this high level in the embodiment of FIG. 2B, many variations and alternatives are possible.

Figure 3:
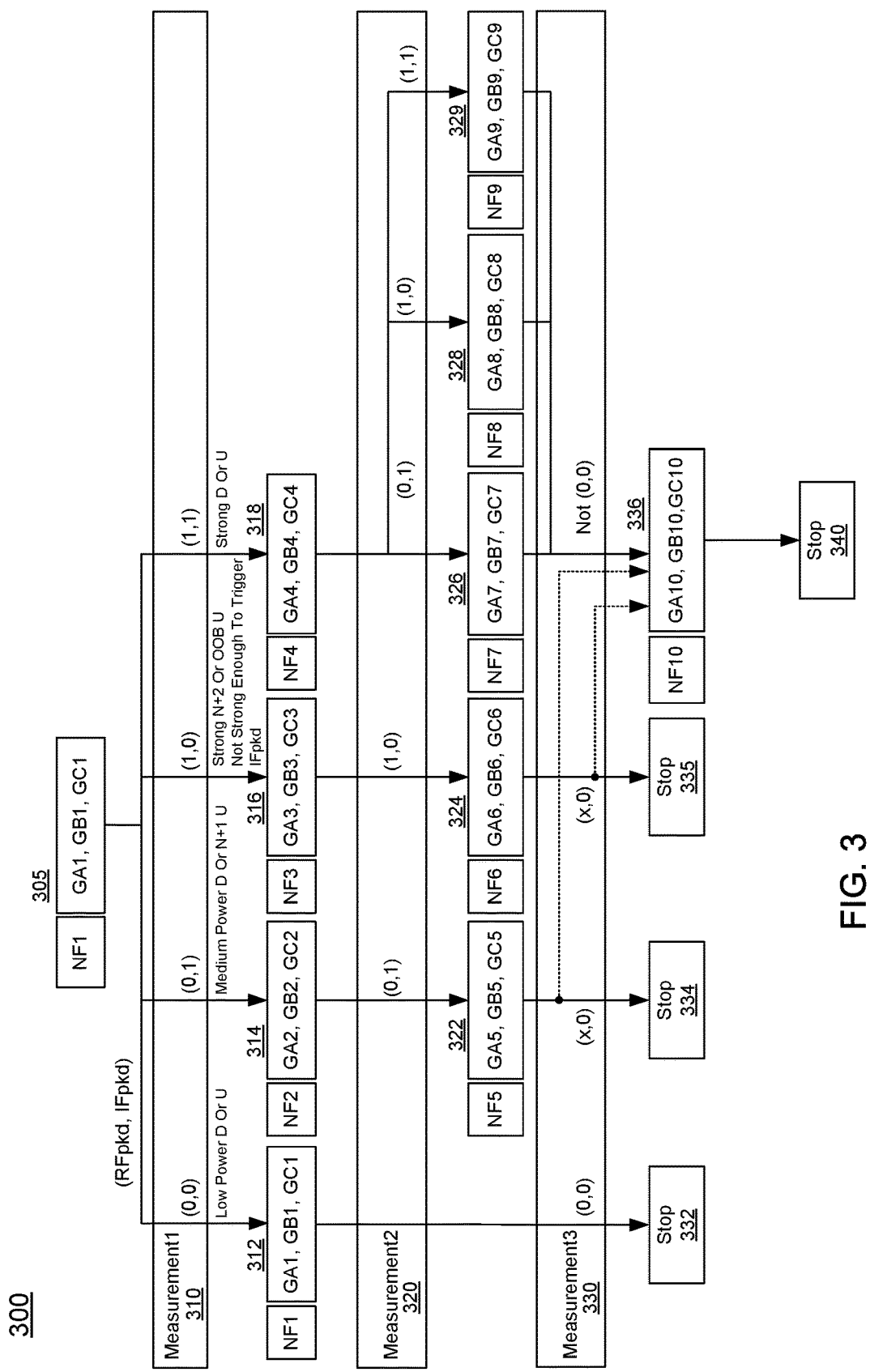
FIG. 3 is a flow diagram of another method in accordance with a still further embodiment.

Referring now to FIG. 3, shown is a flow diagram of a method in accordance with a still further embodiment. More specifically, method 300 shown in FIG. 3 is another representation of an AGC technique in which a variety of predetermined gain settings can be selected based on measurements performed at multiple steps of a gain control process. Method 300 (which may be performed by a controller such as controller 80 in FIG. 1) begins by setting maximum gain settings for each of multiple gain control regions (namely the first second and third gain control regions discussed above as in FIG. 1). In the embodiment shown, these initial gain settings (block 305) provide a first predetermined value (GA1) for the first gain control region, (GB1) for the second gain control region and (GC1) for the third gain control region. As further seen, these predetermined gain settings also correspond to a predetermined noise figure (NF1), which provides information as to how much gain back off is allowed for a next gain setting.

As illustrated in FIG. 3, after these initial gain settings (which may correspond to the maximum gain settings for the controllable gain elements) a first measurement is taken at block 310, namely the outputs of the RF peak detector and the IF peak detector may be received and analyzed. Depending upon the values of these two detector outputs, a gain update may (or may not) occur. More specifically, as shown in FIG. 3, after the first measurement (block 310), there are four possible detector readings ((0,0) (0,1) (1,0) and (1,1)), where the first bit is the output of the RF detector, and the second bit is the output of the IF detector. And as seen, there are four possible corresponding gain settings for the next step (blocks 312, 314, 316 and 318).

As illustrated, when neither peak detector trips (namely a detector reading of (0,0)), it is known that there is either a low power desired channel (D) or a low power undesired channel (U). As such, at block 312 no update occurs and the original, maximum gain settings are maintained. Instead if the reading is (0,1), it is known, a priori, that a blocker can only be a close-in blocker such as an adjacent channel blocker (N+1 blocker) or the desired channel is of medium power. In this case, the minimum desired signal level (PDmin) cannot be lower than: Pth2−U/D−Gtotal(f), where Pth2 is the threshold level of the IF peak detector, U/D is the undesired-to-desired signal ratio, and Gtotal(f) is the total gain including filtering in front of the tripped detector, all in dB. In this case, the gain can be lowered (block 314) until the NF increases by an amount less than PDmin-PDsensitivity, where PDsensitivity is the minimum desired signal power with reliable reception. If the detector output is (1,0) after this first measurement, this indicates that the desired signal is not as strong as the undesired signal and the blocker is a far-out blocker such as an alternate channel (N+2 blocker) or higher offset blocker, and the reading imposes a different PDmin level and the gain back-off is done accordingly using the gain settings at block 316. In this case PDmin cannot be lower than Pth1−U/D−GA1 where Pth1 is the threshold level of the RF peak detector, GA1 is the maximum gain of the front-end passive network (at block 312 of FIG. 3). Finally, if the detector output is (1,1) after this first measurement, this indicates a strong desired or undesired channel, and the gain settings can be updated accordingly at block 318.

Next, after whatever gain update is made to the gain settings (in the given one of blocks 314, 316 or 318), another measurement occurs at block 320. As seen, depending upon the value of these peak detector outputs, a given set of predetermined gain settings (blocks 322, 324, 326, 328 and/or 329) may be used to update the gain components.

Finally, a third measurement occurs (block 330). And a gain update may occur at block 336 if either of the peak detector outputs is tripped. Otherwise, the gain update process concludes (at any of blocks 332, 334, 335 and 340). Note that in the instances in which at most two measurements are made (as indicated at stop points 332, 334 and 335), a fine adjustment may occur to one or more gain components based on RSSI information.

Figure 4:
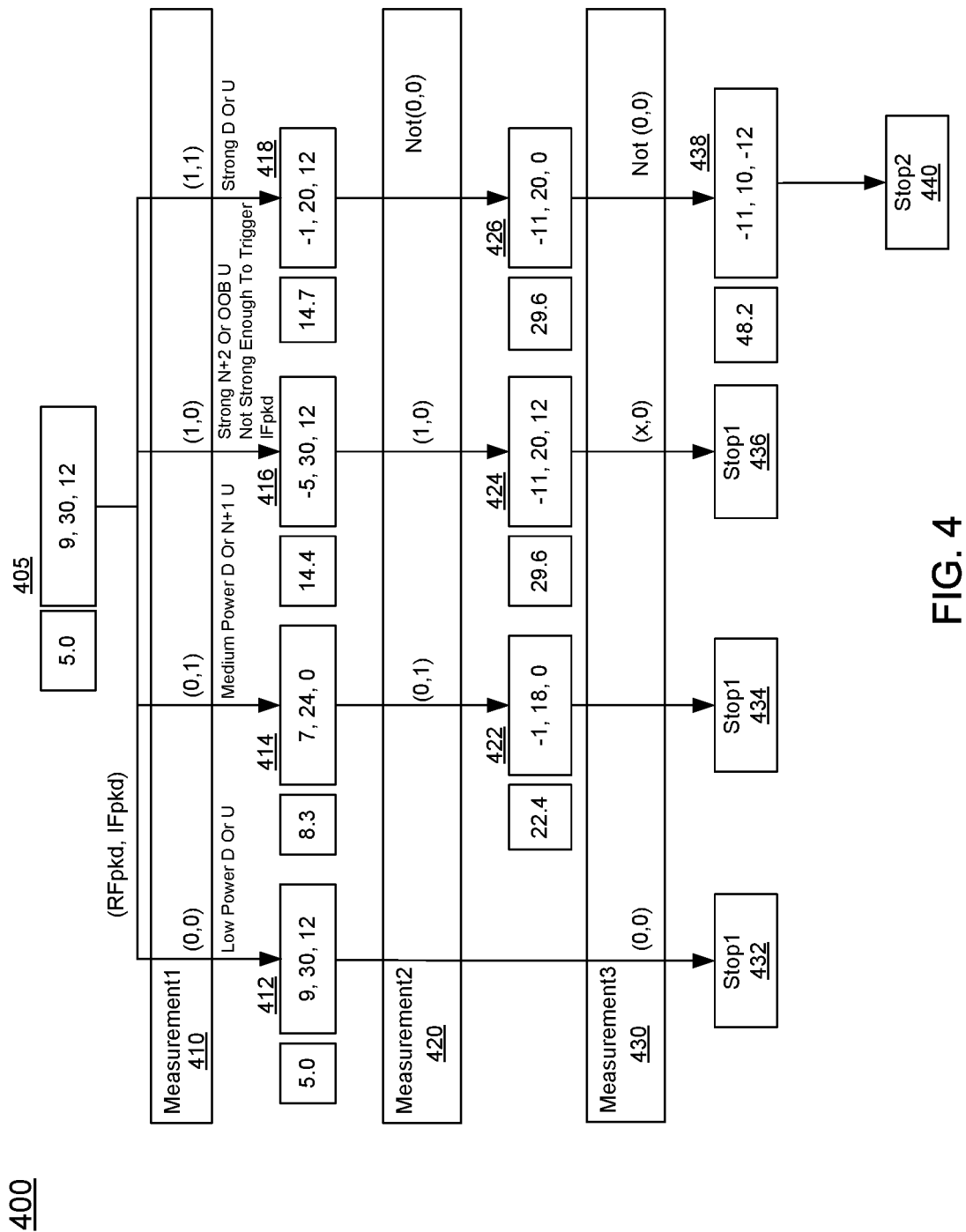
FIG. 4 is a flow diagram of yet another method in accordance with an embodiment.

FIG. 4 is a flow diagram of a method in accordance with yet another embodiment. More specifically, method 400 is another method for performing AGC techniques as described herein. In the embodiment of FIG. 4, particular gain settings for an example receiver are shown, along with corresponding noise figures. For example, at block 405 an initial gain setting may be made to maximum gain settings, corresponding to a total gain of 51 dB (split as shown into 9 dB for a first gain control region, 30 dB for a second gain control region, and 12 dB for a third gain control region). In general, method 400 proceeds as described above with regard to method 300. Specifically, after this initial gain setting at block 405 a first measurement occurs (block 410). Then based upon the peak detector outputs, a gain control update may occur at a given one of blocks 414, 416 or 418 (or maintaining the original gain at block 412). Another measurement may occur at block 420. And appropriate gain control updates may occur at a given one of blocks 422, 424 and 426. Note in this embodiment, compared to the general approach of FIG. 3, the case of a (1,1) reading after a first measurement (block 410) is simplified. More specifically, in second measurement 420, if the decoder reading is not (0,0) (regardless of whether the reading is (0,1), (1,0), or (1,1)), the gains are set to a single setting ((−11,20,0) at block 426). Finally, if a third measurement 430 occurs and either of the detectors trip, control passes to block 438 where a final gain setting update may be performed. Otherwise, method 400 concludes after a single or two measurements (at a given one of blocks 432, 434 and 436). Understand that while the example in FIG. 4 provides specific values for predetermined gain control settings, many other implementations are possible.

In embodiments, AGC operations may provide the following benefits and advantages: (1) faster settling time for a given observation time per AGC step (e.g., <1.5 microseconds (usec) for Bluetooth™ Low Energy and Zigbee™ receiver chains with 0.5 usec per gain setting) (as the signal does not have to propagate to an RSSI determination); (2) or for a fixed overall AGC settling time, more time per step, implying more accurate signal measurement; and (3) compared to RSSI-only AGC algorithms, better visibility of blocker power levels and locations is realized. Therefore, a more optimum gain distribution, depending on blocker characteristics, can be applied. As a result, a receiver can tolerate higher blockers. Embodiments may also be used for non-constant envelope signals (e.g., AM modulated blocker).

Figure 5:
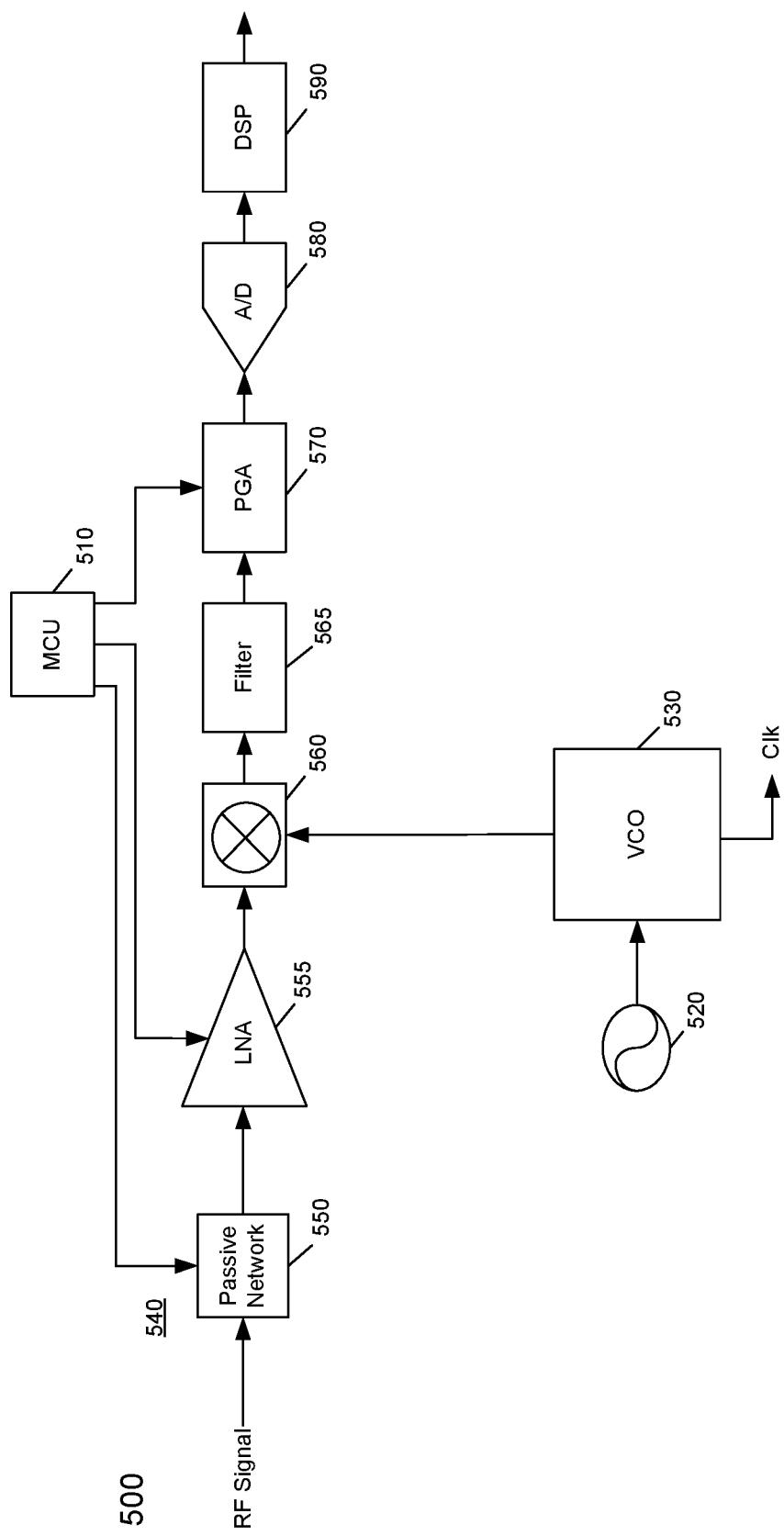
FIG. 5 is a block diagram of an integrated circuit including a receiver as described herein.

Referring now to FIG. 5, shown is a block diagram of an integrated circuit including a receiver having a controller to perform AGC updates as described herein. More specifically as illustrated in FIG. 5, integrated circuit 500 is a representative wireless transceiver such as a WiFi transceiver that may be used in many different types of applications. Of interest here, note that IC 500 includes a microcontroller unit (MCU) 510. In different embodiments, MCU 510 may be implemented as a general-purpose microcontroller that may perform various control operations with regard to the transceiver. More specifically for embodiments herein, MCU 510 may be configured to perform the AGC techniques. To this end, MCU 510 may include or may be coupled to a non-transitory storage medium that stores instructions that when executed enable MCU 510 to dynamically perform the gain control operations discussed herein.

As shown, a signal processing path 540 includes a passive network 550 which, in an embodiment may be implemented as an attenuator such as described above with regard to FIG. 1. As seen, gain control settings may be provided from MCU 510 to passive network 550 to dynamically update gain control settings during a preamble portion of a packet. Passive network 550 in turn is coupled to a low noise amplifier (LNA) 555 to receive and condition an incoming RF signal. As illustrated, LNA 555 may receive gain control settings from MCU 510, as described herein. This conditioned signal in turn is provided to a mixer 560 that is configured to downconvert the incoming RF signal to a lower frequency signal (e.g., a baseband or low intermediate frequency signal) using a mixing signal.

In turn, the downconverted signal is output to a filter 565 that filters the downconverted signal. In turn, this filtered downconverted signal is provided to a programmable gain amplifier (PGA) 570 and in turn to an analog-to-digital (ADC) converter 580 for digitization. As seen, PGA 570 further is coupled to receive gain control settings from MCU 510 to perform the AGC techniques during a preamble portion of a packet as described herein. The resulting digitized signal is provided to a digital signal processor 590 that in turn may further process the incoming signal. Note that this digitized processed signal can be provided to appropriate downstream processing circuitry.

In the embodiment shown, a voltage controlled oscillator (VCO) 530 receives a clock signal from a clock source 520 (which in some cases may be an off-chip clock source). In turn, VCO 530 generates one or more clock signals at a given operating frequency for use within IC 500. Of interest here, a divided version of an input clock signal (e.g., at 2.4 GHz) is provided to mixer 565 of signal processing path 540.

In a representative embodiment, the processed data output by DSP 590 can be provided to another integrated circuit, such as a microcontroller or other programmable circuitry that may process the signals accordingly. As an example, an Internet of Things (IoT) device including a wireless transceiver such as a sensor, monitor or so forth, can be used to measure information or provide user input and communicate such user input via a transmit signal processing path of integrated circuit 500 (not shown for ease of illustration in FIG. 5). In turn, these IoT-communicated signals can be received by another device such as a hub device within a given IoT system, which may in turn communicate the signals, via a central hub computer or so forth, to an Internet-based destination such as a server.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A receiver comprising:
a low noise amplifier (LNA) to receive and amplify a radio frequency (RF) signal, the LNA having a first controllable gain;
a mixer to downconvert the RF signal to an intermediate frequency (IF) signal;
a first filter coupled to the mixer to filter the IF signal;
a programmable gain amplifier (PGA) coupled to the first filter to amplify the filtered IF signal, the PGA having a second controllable gain;
a digitizer to digitize the filtered IF signal to a digitized signal;
a digital signal processor (DSP) to process the digitized signal;
a first power detector to output a first detection signal having a first value in response to the RF signal exceeding a first threshold;
a second power detector to output a second detection signal having a third value in response to the IF signal exceeding a second threshold; and
a controller, at a beginning of a packet communication, to set a maximum gain setting for the LNA and the PGA and to thereafter dynamically update a gain setting of one or more of the LNA and the PGA from the maximum gain setting in response to the first detection signal and the second detection signal, wherein the controller is to further update the gain setting of the one or more of the LNA and the PGA based on received signal strength indication information received from the DSP, the DSP to obtain the received signal strength indication from the processed digitized signal.

2. The receiver of claim 1, wherein, for a first packet communication, the controller is to update the gain setting of the one or more of the LNA and the PGA no more than three times during a preamble portion of the first packet communication, based on the first detection signal and the second detection signal.

3. The receiver of claim 1, wherein the controller is to maintain the maximum gain setting in response to the first detection signal having a second value in response to the RF signal being less than the first threshold and the second detection signal having a fourth value in response to the IF signal being less than the second threshold.

4. The receiver of claim 1, wherein the controller is further to update a gain setting of a passive gain network coupled to receive the RF signal from an antenna and to provide the RF signal to the LNA.

5. The receiver of claim 1, wherein the controller is to update the gain setting of the one or more of the LNA and the PGA to a first predetermined gain setting in response to the second detection signal having the first value and the first detection signal having a second value in response to the RF signal being less than the first threshold.

6. The receiver of claim 5, wherein the controller is to obtain the first predetermined gain setting from a table.

7. The receiver of claim 6, further comprising a non-volatile storage to store the table, the table having a plurality of entries each having predetermined gain settings for at least the LNA and the PGA.

8. The receiver of claim 7, wherein the predetermined gain settings in the plurality of entries are based on a priori knowledge of characteristics of the receiver, including a ratio of undesired-to-desired signal, gain characteristics of the receiver, filtering characteristics of the receiver, and a noise figure as a function of the gain setting of the receiver.

9. At least one non-transitory computer readable storage medium comprising instructions that when executed enable a system to:
at a beginning of a packet communication, set a maximum gain setting for a plurality of gain components of a receiver; and
during a preamble portion of the packet communication, reduce a gain setting for one or more of the plurality of gain components in response to at least one of a first signal output by a first component of the receiver being greater than a first threshold and a second signal output by a second component of the receiver being greater than a second threshold, and update the gain setting for one or more of the plurality of gain components based on received signal strength indicator information output from a digital signal processor (DSP) of the receiver, the DSP to obtain the received signal strength indicator information after digitally processing the second signal.

10. The at least one non-transitory computer readable storage medium of claim 9, further comprising instructions that when executed enable the system to reduce the gain setting using a predetermined gain setting for the one or more of the plurality of gain components, the predetermined gain setting obtained from a non-volatile storage.

11. The at least one non-transitory computer readable storage medium of claim 10, further comprising instructions that when executed enable the system to access the non-volatile storage based at least in part on the first detection signal and the second detection signal to obtain the predetermined gain setting.

12. The at least one non-transitory computer readable storage medium of claim 9, further comprising instructions that when executed enable the system to:
receive a first detection signal from a radio frequency (RF) peak detector of the receiver to identify that the first signal is greater than the first threshold; and
receive a second detection signal from an intermediate frequency (IF) peak detector of the receiver to identify that the second signal is greater than the second threshold.

13. The at least one non-transitory computer readable storage medium of claim 9, further comprising instructions that when executed enable the system to reduce the gain setting for the one or more of the plurality of gain components for no more than two iterations, during the preamble portion of the packet communication.

14. The at least one non-transitory computer readable storage medium of claim 9, further comprising instructions that when executed enable the system to reduce the gain setting for the one or more of the plurality of gain components so that the receiver does not saturate during a payload portion of the packet communication.

15. An apparatus comprising:
an antenna to receive a radio frequency (RF) signal;
a first amplifier coupled to the antenna to amplify the RF signal, the first amplifier having a first controllable gain;
a mixer to downconvert the RF signal to a second frequency signal;
a second amplifier coupled to the mixer to amplify the second frequency signal, the second amplifier having a second controllable gain;
a digitizer to digitize the second frequency signal to a digitized signal;
a digital signal processor (DSP) to process the digitized signal;
a first peak detector to output an active first detection signal in response to the RF signal exceeding a first threshold;
a second peak detector to output an active second detection signal in response to the second frequency signal exceeding a second threshold; and
a gain controller to set, at a beginning of a packet communication, a gain setting of the first amplifier to a first maximum gain setting and set a gain setting of the second amplifier to a second maximum gain setting, and thereafter during a preamble portion of the packet communication to reduce the gain setting of the first amplifier to a first predetermined gain setting and reduce the gain setting of the second amplifier to a second predetermined gain setting in response to at least one of the active first detection signal and the active second detection signal, the gain controller further to update the gain setting of the one or more of the first amplifier and the second amplifier based on received signal strength indication information received from the DSP, the DSP to obtain the received signal strength indication information from the processed digitized signal.

16. The apparatus of claim 15, wherein the gain controller is to maintain the first maximum gain setting and the second maximum gain setting in response to an inactive first detection signal in response to the RF signal being less than the first threshold and an inactive second detection signal in response to the second frequency signal being less than the second threshold.

17. The apparatus of claim 15, wherein the gain controller is further, during the preamble portion, to update the gain setting of at least one of the first amplifier and the second amplifier after the reduction of the gain setting of the first amplifier and the reduction of the gain setting of the second amplifier, based on the received signal strength indication information obtained from the DSP.

18. The apparatus of claim 15, further comprising a non-volatile storage to store a plurality of entries each having predetermined gain settings for at least the first amplifier and the second amplifier, and wherein the gain controller is to access a first entry to obtain the first predetermined gain setting and the second predetermined gain setting based at least in part on the active first detection signal and the active second detection signal.

* * * * *